(12) United States Patent
Lin et al.

(10) Patent No.: US 10,923,022 B2
(45) Date of Patent: Feb. 16, 2021

(54) DISPLAY GATE DRIVERS WITH DYNAMIC AND REDUCED VOLTAGE SWING

(71) Applicant: Apple Inc., Cupertino, CA (US)

(72) Inventors: Chin-Wei Lin, San Jose, CA (US); Fan Gui, San Jose, CA (US); Gihoon Choo, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/692,933

(22) Filed: Nov. 22, 2019

(65) Prior Publication Data

US 2020/0251044 A1 Aug. 6, 2020

Related U.S. Application Data

(60) Provisional application No. 62/801,445, filed on Feb. 5, 2019.

(51) Int. Cl.
G09G 3/296 (2013.01)
H03K 19/00 (2006.01)

(52) U.S. Cl.
CPC ......... G09G 3/296 (2013.01); H03K 19/0019 (2013.01)

(58) Field of Classification Search
CPC .................. G09G 3/296; H03K 19/0019
See application file for complete search history.

(56) References Cited

U.S. PATENT DOCUMENTS

| 8,615,066 | B2 | 12/2013 | Tobita |
| 8,653,893 | B2 | 2/2014 | Tsuchi |
| 8,867,697 | B2 | 10/2014 | Jang et al. |
| 9,466,254 | B2 | 10/2016 | Tan et al. |
| 9,715,860 | B2 | 6/2017 | Yang et al. |
| 2018/0061344 | A1* | 3/2018 | Kurokawa ........... G09G 3/3648 |
| 2020/0258463 | A1* | 8/2020 | Kim ..................... G09G 3/3677 |

FOREIGN PATENT DOCUMENTS

| WO | 2016197531 A1 | 12/2016 |
| WO | 2018059159 A1 | 4/2018 |
| WO | 2019010956 A1 | 1/2019 |
| WO | 2019041853 A1 | 3/2019 |

* cited by examiner

Primary Examiner — Lisa S Landis
(74) Attorney, Agent, or Firm — Treyz Law Group, P.C.; Jason Tsai

(57) ABSTRACT

A display is provided that includes an array of display pixels that receive data signals from display driver circuitry and that receive control signals from gate driver circuitry. The gate driver circuitry may include a chain of row driver circuits. Each row driver circuit in the chain of row driver circuits may include a master driver stage, a slave driver stage, and associated control circuitry configured to receive a clock signal and a pulse signal from a preceding row driver in the chain. The master driver stage may be biased using fixed nominal power supply voltages, whereas the slave driver stage may be biased using dynamically adjustable power supply voltages that are optionally reduced relative to that of the nominal power supply voltages. One or more of the master and slave driver stages may be a bootstrapping driver stage having a bootstrapping capacitor.

22 Claims, 7 Drawing Sheets

DISPLAY GATE DRIVERS WITH DYNAMIC AND REDUCED VOLTAGE SWING

This application claims the benefit of provisional patent application No. 62/801,445, filed Feb. 5, 2019, which is hereby incorporated by reference herein in its entirety.

BACKGROUND

This relates generally to electronic devices with displays and, more particularly, to display driver circuitry for displays such as organic-light-emitting diode displays.

Electronic devices often include displays. For example, cellular telephones and portable computers include displays for presenting information to users.

Displays such as organic light-emitting diode displays have an array of display pixels based on light-emitting diodes. In this type of display, each display pixel includes a light-emitting diode and thin-film transistors for controlling application of a signal to the light-emitting diode to produce light.

The display includes row driver circuits configured to output control signals to the thin-film transistors within each display pixel. The row driver circuits generate one or more scan control signals and emission control signals for selectively enabling and disabling the thin-film transistors during different phases of operation of the display pixels. Typically, the row driver circuits are configured to generate these row control signals with a fixed voltage swing (i.e., all row control signals toggle between a fixed ground power supply voltage and a fixed nominal positive power supply voltage). Row driver circuits with a fixed voltage swing are easy to implement but come at the cost of limited flexibility. It is within this context that the embodiments herein arise.

SUMMARY

An electronic device may include a display having an array of display pixels. The display pixels may receive data signals from display driver circuitry and may receive control signals (e.g., row control signals) from gate driver circuitry. The gate driver circuitry may include a chain of row driver circuits. The odd row drivers may receive a first clock signal, whereas the even row drivers may receive a second clock signal that is different from the first clock signal.

Each row driver may include a first (master) driver stage, a second (slave) driver stage, and associated control circuitry. The first driver stage may be powered using first and second fixed power supply voltages. On the other hand, the second driver stage may be power using third and fourth power supply voltages that are different than the first and second fixed power supply voltages. At least one of the third and fourth power supply voltages may be dynamically adjustable. The difference between the first and second power supply voltages (i.e., nominal power supply voltages) may optionally be greater than the difference between the third and fourth power supply voltages.

The first driver stage may have an output that is directly connected to a succeeding row driver in the chain of row driver circuits. The first driver stage may include a first transistor and a bootstrapping capacitor connected across the gate and source terminals of the first transistor. The second driver stage may include a second transistor and an additional bootstrapping capacitor connected across the gate and source terminals of the second transistor. A pass transistor may be interposed between the first and second transistors. Alternatively, the second driver stage may instead include a second transistor and a loading capacitor connected across the gate and drain terminals of the second transistor, where the loading capacitor is substantially larger than the bootstrapping capacitor (e.g., the loading capacitor may be at least two to ten times larger than the bootstrapping capacitor of the first driver stage). If desired, all transistors within the row driver circuit can be implemented using only p-channel transistors.

DETAILED DESCRIPTION

Figure 1:
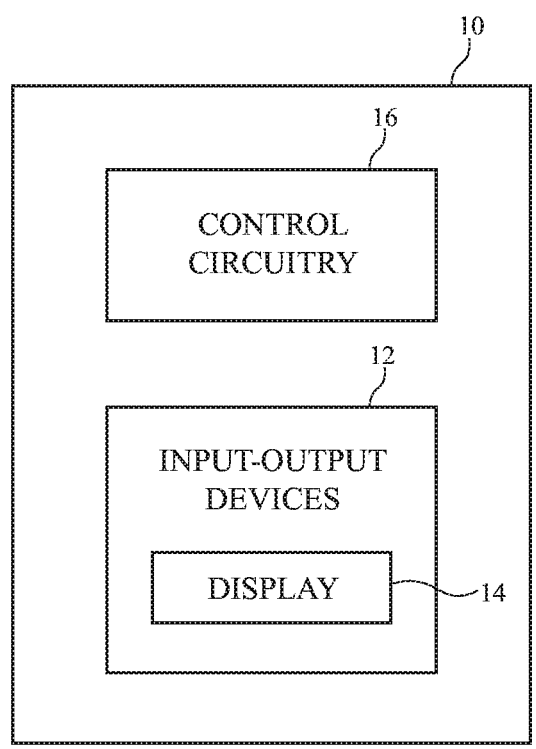
FIG. 1 is a diagram of an illustrative electronic device having a display in accordance with an embodiment.

An illustrative electronic device of the type that may be provided with a display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 using an array of pixels in display 14.

Device 10 may be a tablet computer, laptop computer, a desktop computer, a display, a cellular telephone, a media player, a wristwatch device or other wearable electronic equipment, or other suitable electronic device.

Display 14 may be an organic light-emitting diode display or may be a display based on other types of display technology. Configurations in which display 14 is an organic light-emitting diode display are sometimes described herein as an example. This is, however, merely illustrative. Any suitable type of display may be used in device 10, if desired.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
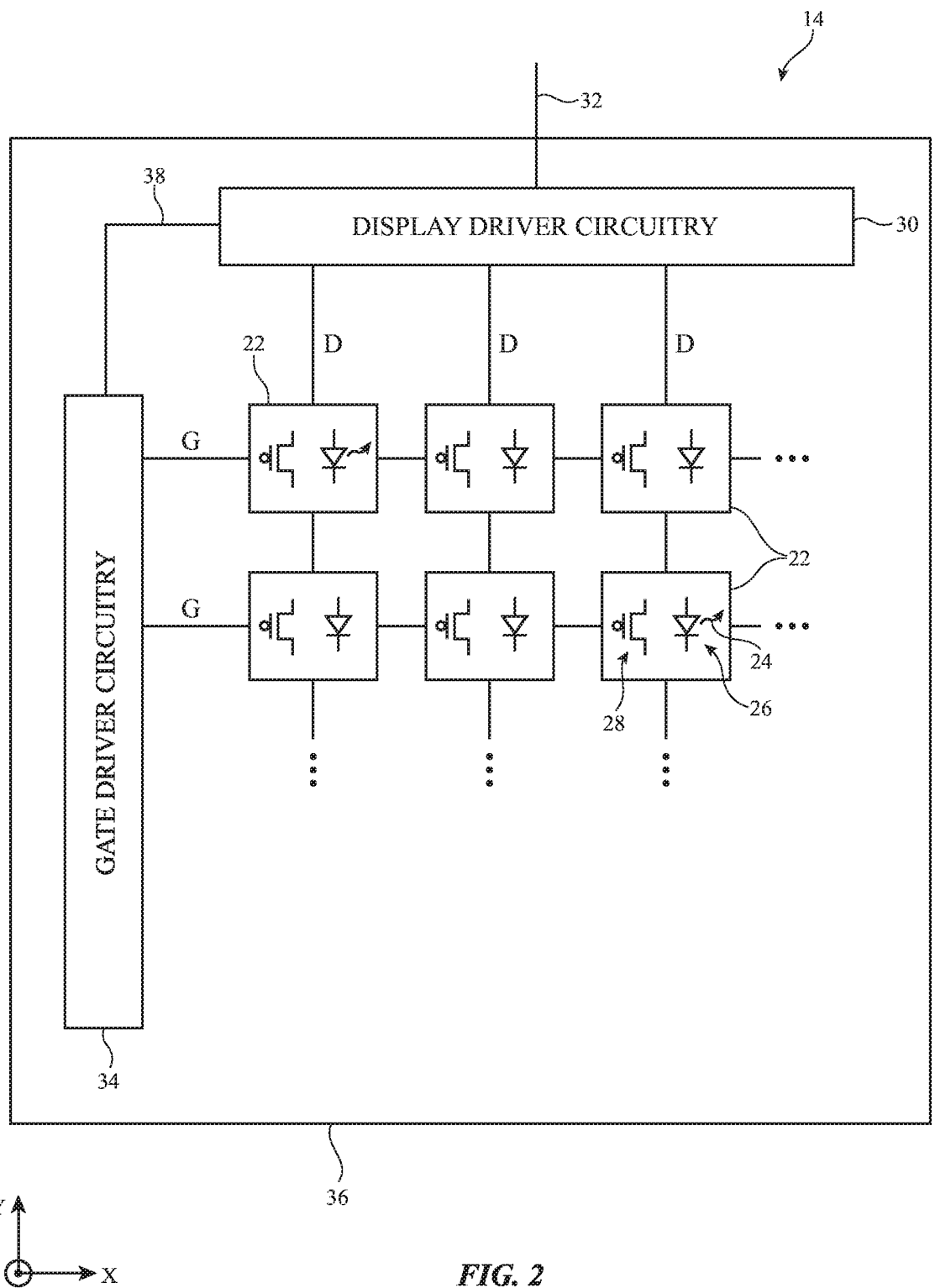
FIG. 2 is a diagram of an illustrative display having an array of organic light-emitting diode display pixels in accordance with an embodiment.

A top view of a portion of display 14 is shown in FIG. 2. As shown in FIG. 2, display 14 may have an array of pixels 22 formed on substrate 36. Substrate 36 may be formed from glass, metal, plastic, ceramic, or other substrate materials. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may have a light-emitting diode 26 that emits light 24 under the control of a pixel control circuit formed from thin-film transistor circuitry such as thin-film transistors 28 and thin-film capacitors). Thin-film transistors 28 may be polysilicon thin-film transistors, semiconducting-oxide thin-film transistors such as indium zinc gallium oxide transistors, or thin-film transistors formed from other semiconductors. Pixels 22 may contain light-emitting diodes of different colors (e.g., red, green, and blue) to provide display 14 with the ability to display color images.

Display driver circuitry may be used to control the operation of pixels 22. The display driver circuitry may be formed from integrated circuits, thin-film transistor circuits, or other suitable electronic circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply circuitry 30 with information on images to be displayed on display 14.

To display the images on display pixels 22, display driver circuitry 30 may supply image data to data lines D (e.g., data lines that run down the columns of pixels 22) while issuing clock signals and other control signals to supporting display driver circuitry such as gate driver circuitry 34 over path 38. If desired, circuitry 30 may also supply clock signals and other control signals to gate driver circuitry 34 on an opposing edge of display 14 (e.g., the gate driver circuitry may be formed on more than one side of the display pixel array).

Gate driver circuitry 34 (sometimes referred to as horizontal line control circuitry or row control circuitry) may be implemented as part of an integrated circuit and/or may be implemented using thin-film transistor circuitry. Horizontal/row control lines G in display 14 may carry gate line signals (scan line signals), emission enable control signals, and other horizontal control signals for controlling the pixels of each row. There may be any suitable number of horizontal control signals per row of pixels 22 (e.g., one or more row control lines, two or more row control lines, three or more row control lines, four or more row control lines, five or more row control lines, etc.).

Figure 3:
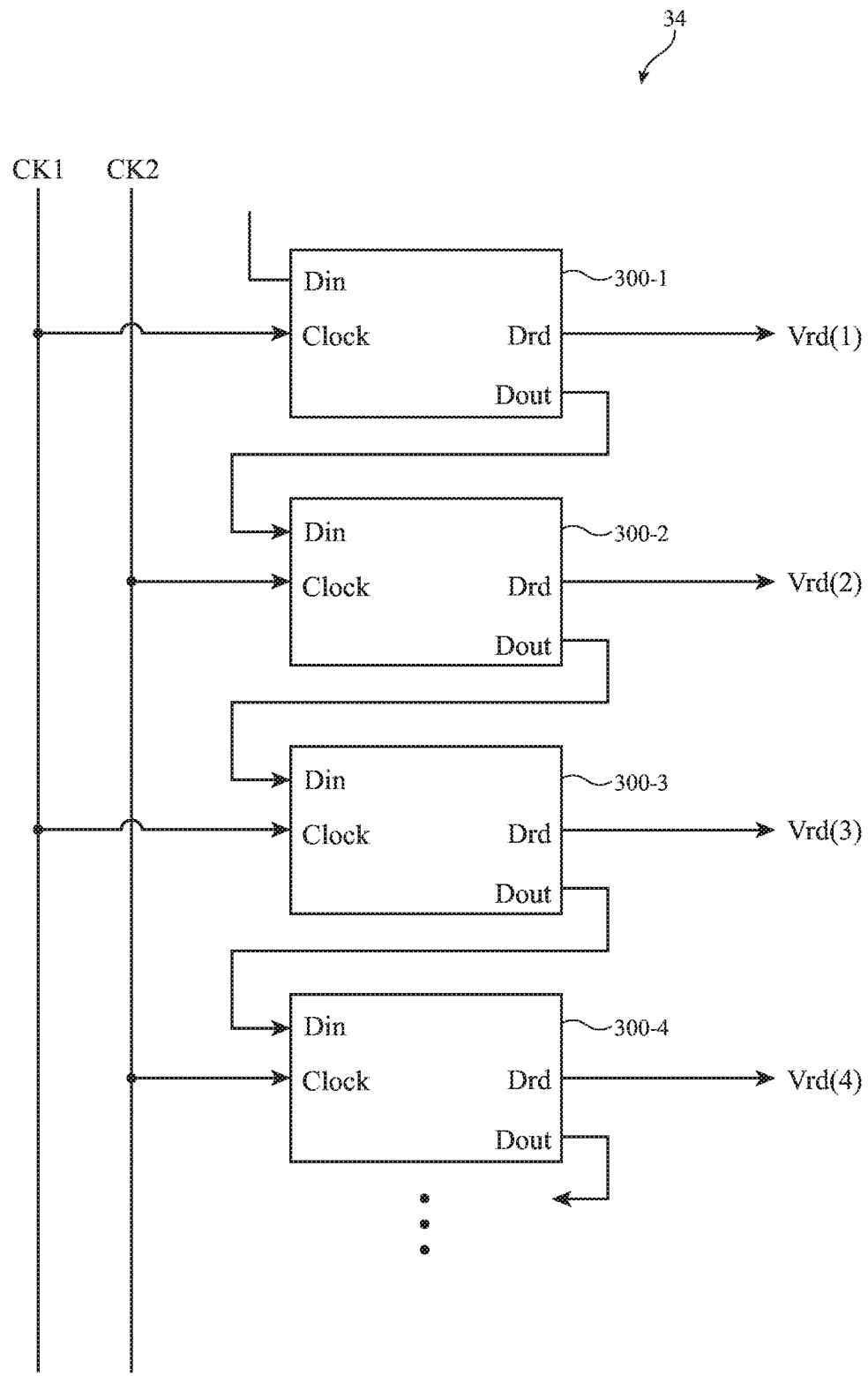
FIG. 3 is a diagram of illustrative gate driver circuitry having a chain of row driver circuits in accordance with an embodiment.

FIG. 3 is a diagram showing how gate driver circuitry 34 may include multiple row driver circuits 300 connected in a chain. As shown in FIG. 3, each row driver 300 may have a data input port ("Din"), a clock input port, a data output port ("Dout"), and a gate line output port. In particular, a reduced dynamic voltage signal Vrd can be generated on the gate line output port, so the gate line output port can sometimes be referred to as the reduced dynamic signal output port ("Drd"). Signal Vrd may be fed to corresponding thin-film transistors in each display pixel 22 located along a given row via a corresponding gate/row line. For example, row driver 300-1 may output signal Vrd(1) to control display pixel transistors located along a first row in the array of display pixels, row driver 300-2 may output signal Vrd(2) to control display pixel transistors located along a second row in the array of display pixels, row driver 300-3 may output signal Vrd(3) to control display pixel transistors located along a third row in the array of display pixels, etc.

In particular, signal Vrd generated at the Drd output of each row driver 300 may have dynamically adjustable power levels so that the voltage swing of Vrd can be dynamically increased or decreased relative to a nominal power supply potential. Configured in this way, the gate driver circuitry 34 is provided with enhanced flexibility (e.g., by providing the display with the ability to dynamically adjust the power supply bias levels of the row control signals and thereby control the amount of stress that is applied to each display pixel 22) while controlling the amount of power consumption of display 14. For instance, by dynamically reducing the voltage swing of Vrd relative to the nominal voltage swing of the rest of the display, power consumption can be minimized.

The row driver circuits in the odd rows may be configured to receive a first clock signal. In the example of FIG. 3, row driver 300-1 and row driver 300-3 in the first and third rows are configured to receive a first clock signal CK1. The row driver circuits in the even rows may be configured to receive a second clock signal that is different than the first clock signal. As shown in FIG. 3, row driver 300-2 and row driver 300-4 in the second and fourth rows are configured to receive a second clock signal CK2. Clock signals CK1 and CK2 may have the same frequency or may have different frequencies. If desired, clock signals CK1 and CK2 may be phase aligned or may be phase offset from one another.

The Dout port of one row driver circuit may be directly connected to the Din port of a succeeding row driver circuit. In the example of FIG. 3, row driver 300-1 has a Dout terminal that is directly connected to the Din terminal of row driver 300-2. Similarly, row driver 300-2 has a Dout terminal that is directly connected to the Din terminal of row driver 300-3, and so on. Connecting the various row driver circuits in this way allows the gate output signals to propagate from one row to the next in a successive fashion without having to individually trigger or activate each gate driver circuit using a separate start pulse. The example of FIG. 3 in which gate driver circuitry includes four row driver circuits 300 is merely illustrative. In general, gate driver circuitry 34 may include hundreds or thousands of row driver circuits 300 coupled together in series to generate row control signals for a display of any suitable size.

Figure 4:
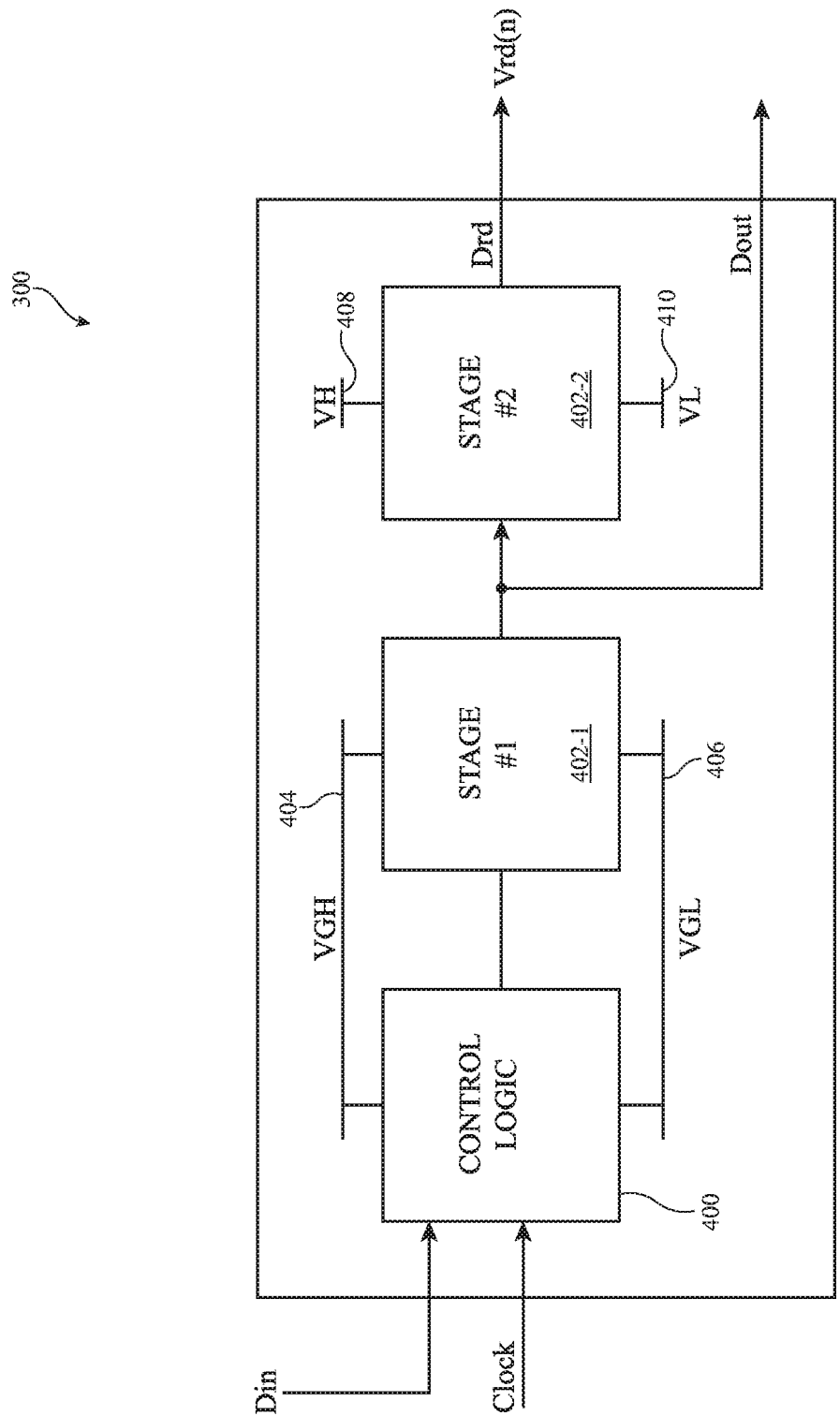
FIG. 4 is a diagram of an illustrative row driver circuit that includes multiple driver stages in accordance with an embodiment.

FIG. 4 is a diagram of an illustrative row driver circuit 300. As shown in FIG. 4, row driver 300 may include control circuitry such as control logic 400, a first driver stage such as driver stage 402-1, and a second driver stage such as driver stage 402-2. Control logic 400 may receive data signals via the Din port and a clock signal via the clock input port and may generate corresponding control signals for controlling at least the first driver stage 402-1 and/or optionally the second driver stage 402-2. The control logic 400 and the first driver stage 402-1 may be coupled to a first positive power supply rail 404 (e.g., a power supply terminal on which positive power supply voltage VGH is provided) and a first ground power supply rail 406 (e.g., a power supply terminal on which ground power supply voltage VGL is provided). The output of the first driver stage 402-1 serves as the Dout port.

In contrast, the second driver stage 402-2 may be coupled to a second positive power supply rail 408 (e.g., a power supply terminal on which positive power supply voltage VH is provided) and a second ground power supply rail 410 (e.g., a power supply terminal on which ground power supply voltage VL is provided). Power supply voltages VGH and VGL on power rails 404 and 406 may be fixed, whereas power supply voltages VH and VL on power rails 408 and 410 may be dynamically adjustable. By supplying only the second driver stage 402-2 with adjustable voltage rails, the second driver stage 402-2 is operable to generate voltage Vrd(n) with an adjustable voltage swing, which offers a technical improvement in terms of flexibility while offering the display with the capability to balance stress levels during different modes of operation. For instance, it might be advantageous for Vrd to exhibit a first amount of voltage swing during an emission phase and to exhibit a second amount of voltage swing during non-emission phases to help balance out the amount of voltage stress experienced by the display pixel thin-film transistors.

Moreover, it might also be beneficial to reduce the voltage swing of Vrd relative to the nominal power supply rails VGH and VGL. To accomplish this, voltages VH and VL might be adjusted such that the difference (VH minus VL) will be less than the difference (VGH minus VGL). In other words, row driver circuit 300 is provided is two voltage domains: (1) a first voltage domain associated with VGH and VGL and (2) a second voltage domain associated with VH and VL. The first (nominal) voltage domain, which is higher than the second voltage domain, ensures that the control logic 400 is able to operate properly and that signals are propagating appropriately down the chain of row drivers. The second reduced voltage domain allows the second driver stage 402-2 to operate with improved freedom while also saving power.

Figure 5:
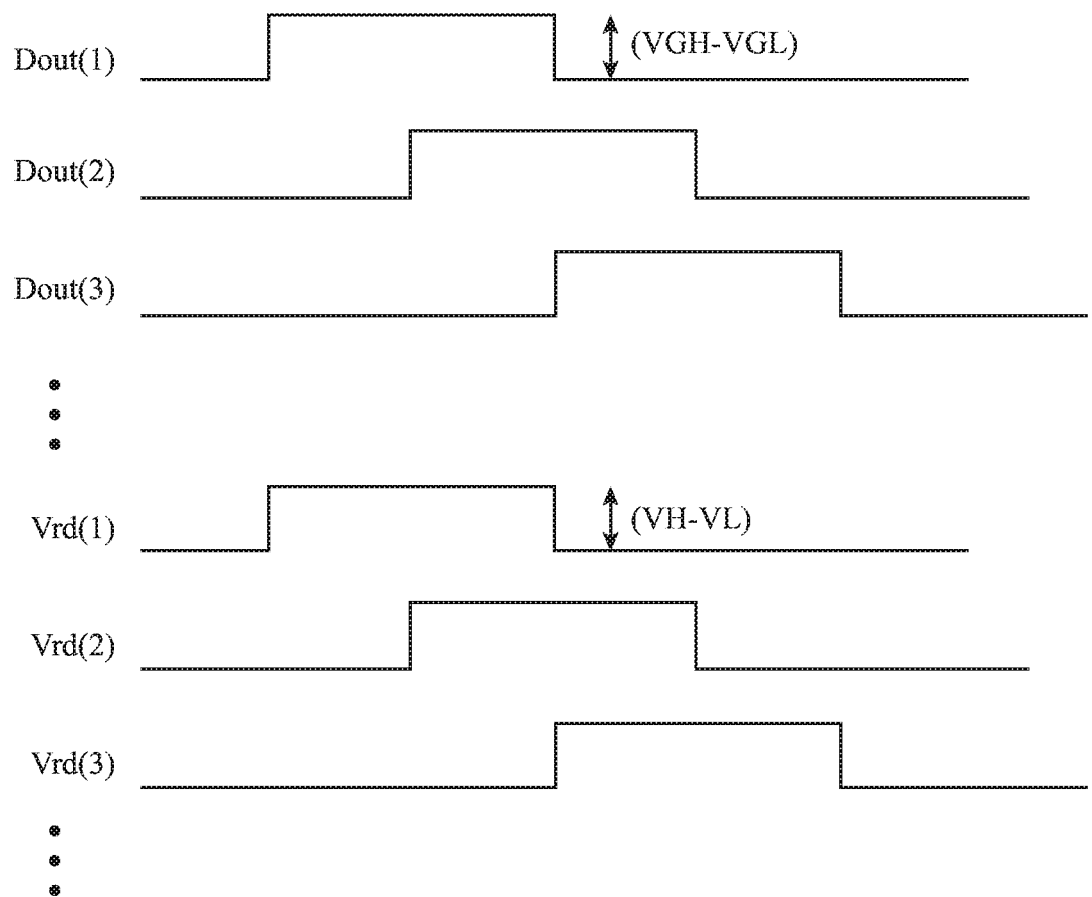
FIG. 5 is a timing diagram showing how the row driver circuit of FIG. 4 can be used to generate an output signal with reduced voltage swing in accordance with an embodiment.

FIG. 5 is a timing diagram showing output signals that can be generated by the various row driver circuits within gate driver circuitry 34. As shown in FIG. 5, data output signals Dout(1), Dout(2) and Dout(3) may be generated by row drivers 300-1, 300-2, and 300-3, respectively. The Dout signals (as shown in FIG. 4) are generated at the output of the first driver stage in each row driver 300 and thus toggle between fixed power supply voltages VGH and VGL. The actual row control signals Vrd(1), Vrd(2), and Vrd(3) may be provided at the row control lines driven by drivers 300-1, 300-2, and 300-3, respectively. The Vrd signals (as shown in FIG. 4) are generated at the output of the second driver stage in each row driver 300 and may thus toggle between dynamically adjustable power supply voltages VH and VL.

In one suitable arrangement, voltages VH and/or VL are dynamically adjusted such that the voltage swing of Vrd is less than the voltage swing of Dout (i.e., such that (VH−VL) is less than (VGH−VGL)). In another suitable arrangement, voltages VH and/or VL can be dynamically adjusted such that the voltage swing of Vrd is greater than the voltage swing of Dout (i.e., such that (VGH−VGL) is less than (VH−VL)). If desired, the voltage swings of Dout and Vrd can also be adjusted to be equal. Still referring to FIG. 5, successive row control signals may at least partially overlap with one another. For instance, signal Vrd(1) may still be high when Vrd(2) is asserted. Similarly, signal Vrd(2) may still be asserted when Vrd(3) is driven high. In general, any amount of overlap between the gate line output signals can be implemented. In yet other suitable embodiments, Vrd(n) can be generated such that no overlap is present.

Figure 6:
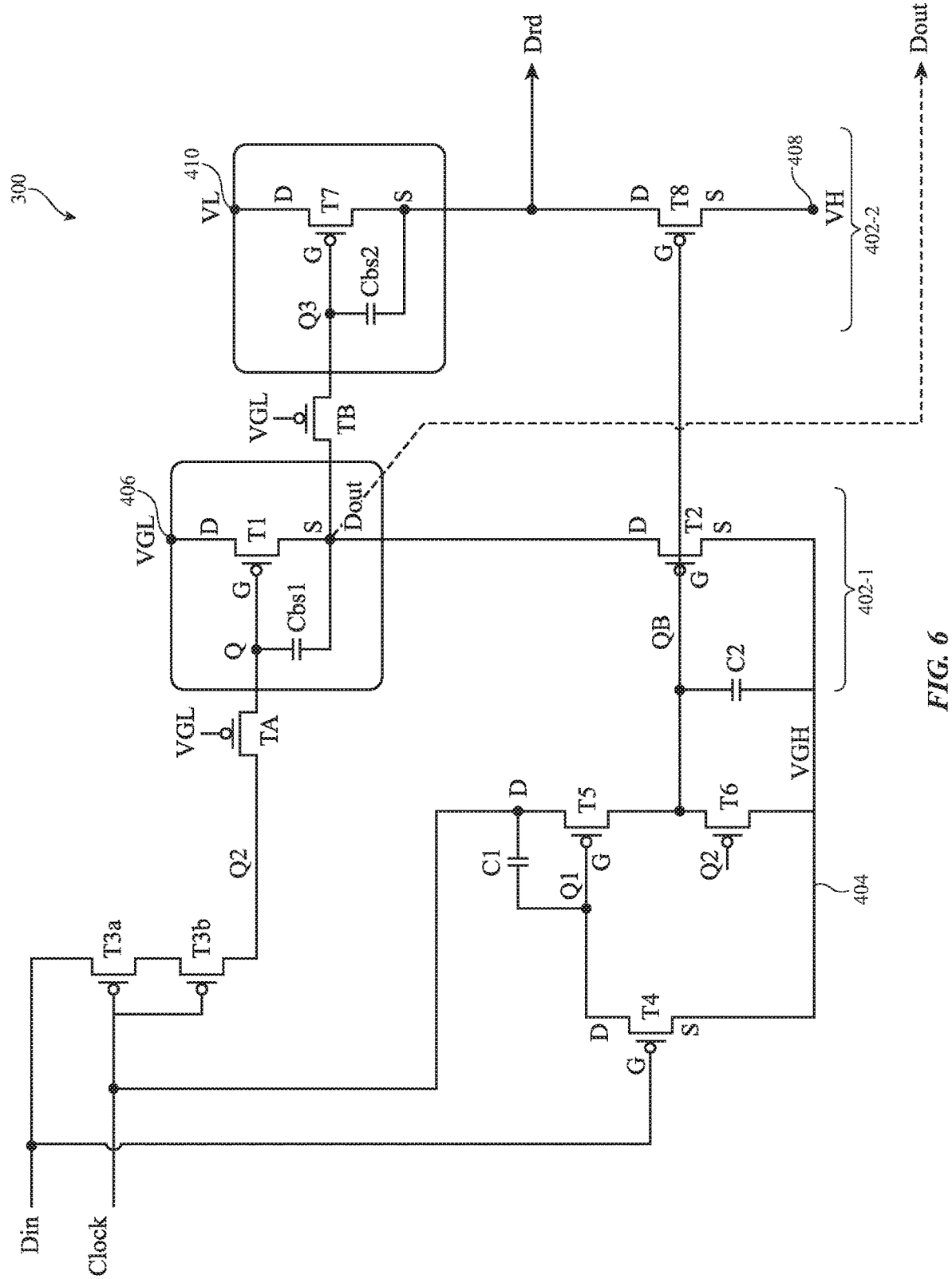
FIG. 6 is a circuit diagram showing one illustrative implementation of a row driver circuit with two bootstrapping stages in accordance with an embodiment.

FIG. 6 is a circuit diagram showing one suitable implementation of row driver circuit 300 with two bootstrapping stages. As shown in FIG. 6, row driver 300 includes at least a first driver stage 402-1, a second driver stage 402-2, and associated control circuitry (e.g., transistors T3a, T3b, T4 T5, and T6). Although all transistors in the example of FIG. 6 are p-channel (p-type) thin-film transistors, row driver circuit 300 may also be implemented using one or more n-channel thin-film transistors (i.e., the polarities can be flipped).

Transistors T3a and T3b may be connected in stacked in series between the Din port and first internal node Q2. Transistors T3a and T3b may each have a gate terminal that receives an input clock signal from the clock port. Configured in this way, transistors T3a and T3b collectively serve as a gating circuit that is selectively activated using the input clock signal to load in a data signal from the Din port onto node Q2. Transistor TA may act like a first pass transistor for selectively feeding the data signal from node Q2 to another internal node Q of the first driver stage 402-1. Transistor TA has a gate terminal that is shorted to power supply voltage VGL. Connected in this way, transistor TA is normally turned on but will be turn off when either node Q or Q2 falls below (VGL−Vth), where Vth is equal to the threshold voltage of transistor TA. Transistor TA may optionally be considered to be part of first driver stage 402-1.

Transistors T5 and T6 may be connected in series between the clock input port and power supply line 404 (e.g., the power supply terminal on which voltage VGH is provided). Transistor T6 may have a gate terminal that is connected to node Q2. A first capacitor C1 is connected across the gate and drain terminals of transistor T5. Transistor T4 may have a source terminal connected to power line 404, a drain terminal connected to the gate terminal of transistor T5 (also labeled as internal node Q1), and a gate terminal connected to the Din port. The node interposed between transistors T5 and T6 is labeled as node QB, which is connected to first driver stage 402-1.

First driver stage 402-1 includes transistor T1 coupled in series with transistor T2. Transistor T1 has a drain terminal connected to ground line 406 (i.e., the ground line on which fixed voltage VGL is provided), a gate terminal connected to node Q, and a source terminal that directly drives the Dout port of row driver 300. A first bootstrapping capacitor Cbs1 is connected across the gate and source terminals of transistor T1. Transistor T2 has a source terminal connected to power supply terminal 404, a drain terminal connected to the Dout port, and a gate terminal connected to node QB. A shunt capacitor C2 is connected across the source and gate terminals of transistor T2. Capacitor C2 may optionally be considered as part of first driver stage 402-1. As described above, transistor TA will be switched off when node Q reaches (VGL−Vth). When this happens, node Q will be electrically floating so no current is able to flow out of node Q; thus, the amount of voltage across bootstrap capacitor Cbs1 cannot change either. At this point, transistor T1 will be able to pull the Dout port even lower. Any amount of voltage change at Dout after transistor TA has been turned off will be reflected directly at node Q via bootstrap capacitor Cbs1.

Transistor TB may be coupled between the first and second driver stages. Transistor TB may act like a second pass transistor for selectively feeding signals from the Dout port to another internal node Q3 of the second driver stage 402-2. Transistor TB has a gate terminal that is shorted to power supply voltage VGL. Connected in this way, transistor TB is normally turned on but will be turn off when either port Dout or node Q3 falls below (VGL−Vth). Configured in this way, transistor TB may serve to isolate the first and second driver stages within row driver 300 so that other rows will not be adversely affected by any subsequent change at the second driver stage 402-2.

Second driver stage 402-2 may include transistor T7 coupled in series with transistor T8. Transistor T7 has a drain terminal connected to ground terminal 410 (i.e., the ground line on which dynamically adjustable voltage VL is provided), a gate terminal connected to node Q3, and a source terminal that directly drives the Drd port of row driver 300. A second bootstrapping capacitor Cbs2 is connected across the gate and source terminals of transistor T7. Transistor T8 has a source terminal connected to power supply terminal 408 (i.e., the power line on which dynamically adjustable voltage VH is provided), a drain terminal connected to the Drd port, and a gate terminal connected to node QB. The gate terminals of transistors T2 and T8 are therefore electrically shorted to one another. In the embodiment of FIG. 6, there is no constraint on voltage VL since we have implemented two bootstrapping stages, which prevents any Vth loss across the p-channel drive transistors T1 and T7 when pulling the output signal low. Thus, voltage VL can be optionally set to VGL or any other suitable low voltage level as desired. In contrast, voltage VH can be dynamically set to a voltage level that is less than VGH.

Similar to the first driver stage, transistor TB will be switched off when the Dout port or node Q3 reaches (VGL−Vth). When this happens, node Q3 will be electrically floating so no current is able to flow out of node Q3; thus, the amount of voltage across bootstrap capacitor Cbs2 cannot change either. At this point, transistor T7 will be able to pull the Drd port even lower. Any amount of voltage change at Drd after transistor TB has been turned off will be reflected directly at node Q3 via bootstrap capacitor Cbs2. Configured in this way, first driver stage 402-1 is able to operate properly in the nominal voltage domain while minimizing any unwanted Vth loss using first bootstrapping capacitor Cbs1, whereas second driver stage 402-2 is able to operate properly in the reduced voltage domain while similarly minimizing any undesired Vth loss using second bootstrapping capacitor Cbs2.

Figure 7:
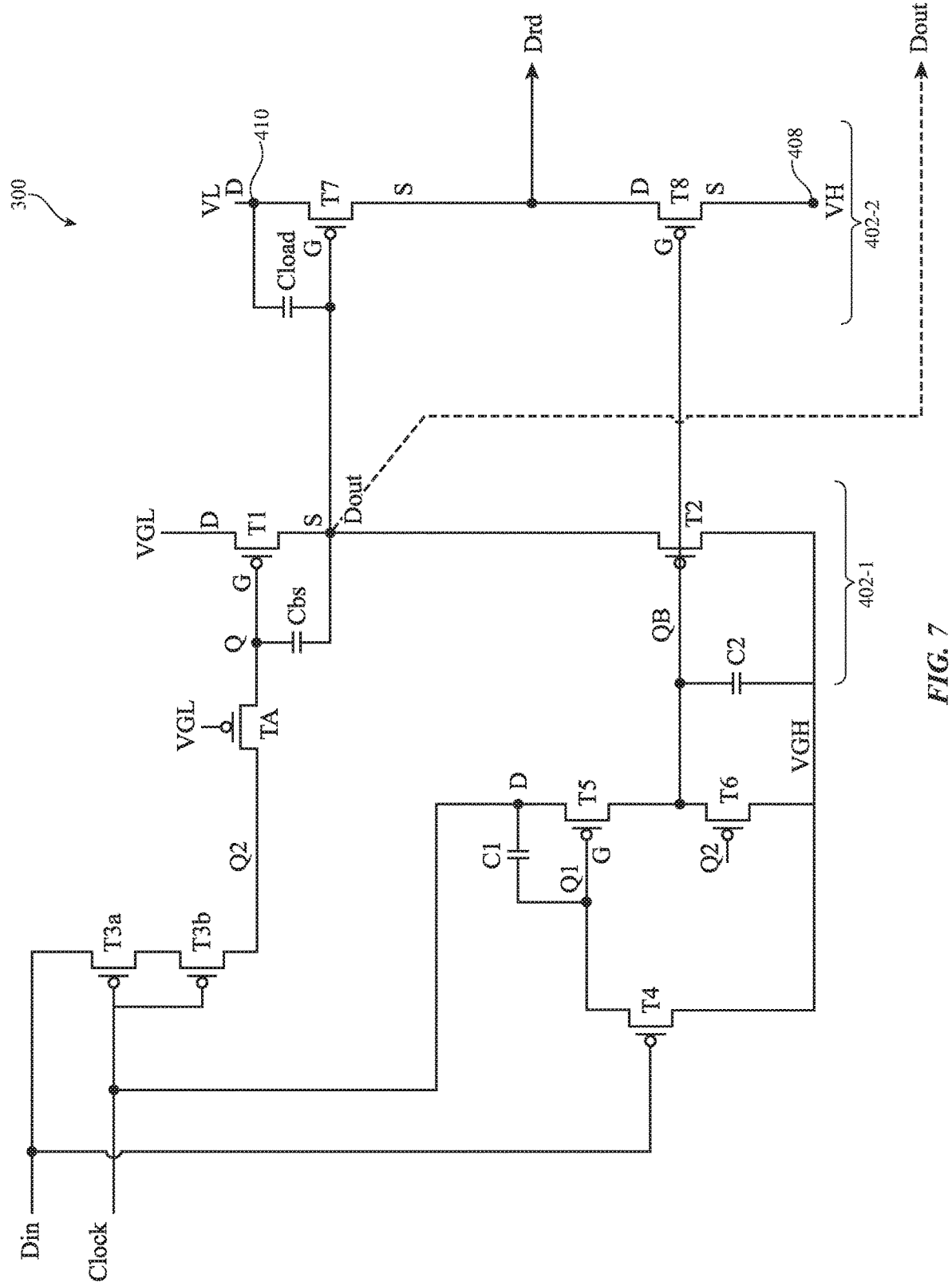
FIG. 7 is a circuit diagram showing another illustrative implementation of a row driver circuit with a first bootstrapping stage connected in series with a second buffer stage in accordance with an embodiment.

FIG. 7 is a circuit diagram showing another illustrative implementation of a row driver circuit with a first bootstrapping stage connected in series with a second buffer stage in accordance with an embodiment. As shown in FIG. 7, the function and structure of the first driver stage 402-1 and the associated control circuitry are substantially similar to that already described in connection with FIG. 6 and thus need not be reiterated in detail to avoid obscuring the present embodiments. Unlike the example of FIG. 6, however, row driver circuit 300 of FIG. 7 does not include a pass transistor TB interposed between the Dout node and second driver stage 402-2.

Second driver stage 402-2 may include transistor T7 and transistor T8 coupled in series between power supply terminals 408 and 410. In particular, transistor T7 has a drain terminal connected to ground terminal 410 (i.e., the ground line on which dynamically adjustable voltage VL is provided), a gate terminal directly connected to the Dout port, and a source terminal that directly drives the Drd port of row driver 300. Transistor T8 has a source terminal connected to power supply terminal 408 (i.e., the power line on which dynamically adjustable voltage VH is provided), a drain terminal connected to the Drd port, and a gate terminal connected to node QB. The gate terminals of transistors T2 and T8 are therefore electrically shorted to one another.

Unlike FIG. 6, the second driver stage 402-2 in FIG. 7 does not include any bootstrapping capacitor connected across the gate and source terminals of transistor T7. This places a constraint on what voltage VL can be. For instance, voltage VL can be dynamically adjusted but should be at least greater than (VGL−Vth'), where Vth' represents the threshold voltage of transistor T7. Due to the lack of a bootstrapping capacitor in the second driver stage, an additional load capacitor Cload should be connected across the gate and drain terminals of transistor T7. Alternatively, capacitor Cload may be a shunt capacitor that is connected to power supply terminal 408 or any other suitable power supply line within the display. The capacitance of capacitor Cload may be substantially greater than that of capacitor Cbs of the first driver stage to help with the bootstrapping of the first driver stage and to also help stabilize the voltage at the gate node of transistor T7. For example, the capacitance of Cload may be at least two times greater than Cbs, at least three times greater than Cbs, at least four times greater than Cbs, four to eight times greater than Cbs, or any suitable multiple of Cbs.

In general, the row driver circuits described in connection with FIGS. 3-7 can be used to provide dynamically adjustable control signals to any number of display pixels within a display. The separation of two or more driver/buffer stages in each row driver allows the use of separate voltage rails. The voltage rail of the first driver stage represents a nominal voltage that is used to drive signals down the chain of row drivers, whereas the voltage rail of the second driver stage represents an adjustable (e.g., reduced) voltage rail that is used only to drive the control signals directly but is not directly connected to the subsequent row driver. The first driver stage is sometimes referred to as the "master" driver or buffer stage, whereas the second driver stage can be referred to as the "slave" driver or buffer stage. If desired, more than two driver stages can be implemented within each row driver, where one or more stages includes a bootstrapping or loading/shunt capacitor.

The foregoing is merely illustrative and various modifications can be made by those skilled in the art without departing from the scope and spirit of the described embodiments. The foregoing embodiments may be implemented individually or in any combination.

What is claimed is:

1. A display, comprising:
   an array of display pixels; and
   gate driver circuitry configured to output control signals to the array of display pixels, wherein the gate driver circuitry comprises a chain of row driver circuits, wherein each row driver circuit in the chain comprises:
   a first driver stage powered using a first power supply terminal on which a first power supply voltage is provided and powered using a second power supply terminal on which a second power supply voltage that is different than the first power supply voltage is provided; and
   a second driver stage powered using a third power supply terminal on which a third power supply voltage is provided and using a fourth power supply terminal on which a fourth power supply voltage that is different than the third power supply voltage is provided, wherein the first, second, third, and fourth power supply terminals are separate power supply lines.

2. The display of claim 1, wherein the second driver stage is configured to receive signals from the first driver stage.

3. The display of claim 1, wherein the first and second power supply voltages are fixed power supply voltages.

4. The display of claim 3, wherein at least one of the third and fourth power supply voltages are dynamically adjustable power supply voltages.

5. The display of claim 3, wherein the third and fourth power supply voltages are dynamically adjustable power supply voltages.

6. The display of claim 4, wherein the difference between the first and second power supply voltages is greater than the difference between the third and fourth power supply voltages.

7. The display of claim 1, wherein the first driver stage has an output that is directly connected to a succeeding row driver circuit in the chain of row driver circuits.

8. The display of claim 1, wherein the first driver stage includes a first transistor and a bootstrapping capacitor connected across the gate and source terminals of the first transistor.

9. The display of claim 8, wherein the second driver stage includes a second transistor and an additional bootstrapping capacitor connected across the gate and source terminals of the second transistor.

10. The display of claim 9, further comprising a pass transistor interposed between the first and second transistors.

11. The display of claim 8, wherein the second driver stage includes a second transistor and a loading capacitor connected across the gate and drain terminals of the second transistor.

12. The display of claim 11, wherein the loading capacitor is larger than the bootstrapping capacitor.

13. The display of claim 12, wherein the loading capacitor is at least two times larger than the bootstrapping capacitor.

14. The display of claim 12, wherein the loading capacitor is at least four times larger than the bootstrapping capacitor.

15. The display of claim 1, wherein the first and second driver stages include only p-channel transistors.

16. A method of operating a display, comprising:
    using an array of display pixels to display an image;
    using display driver circuitry to provide data signals to the array of display pixels; and
    using gate driver circuitry to provide control signals to the array of display pixels, wherein the gate driver circuitry comprises a chain of row drivers, and wherein the gate driver circuitry generates the control signals by:
    using a first driver stage to generate an output signal that is fed to a succeeding row driver in the chain;
    using a second driver stage to receive the output signal from the first driver stage and to generate one of the control signals for the array of display pixels;
    powering the first driver stage using only fixed power supply voltages; and
    powering the second driver stage using at least one dynamically adjustable power supply voltage.

17. The method of claim 16, further comprising reducing the dynamically adjustable power supply voltage relative to a positive power supply voltage in the fixed power supply voltages.

18. The method of claim 16, further comprising:
    providing a first clock signal to odd row drivers in the chain; and
    providing a second clock signal to even row drivers in the chain, wherein the first and second clock signals are different clock signals.

19. The method of claim 16, further comprising using only the first driver stage to drive a succeeding row driver in the chain.

20. A display gate driver circuit, comprising:
    a master driver stage that includes a first pull-up transistor, a first pull-down transistor, and a bootstrapping capacitor coupled to the first pull-down transistor;
    a slave driver stage that includes a second pull-up transistor and a second pull-down transistor;
    fixed power supply lines configured to power the master driver stage; and
    a dynamically adjustable power supply line configured to power only the slave driver stage.

21. The display gate driver circuit of claim 20, wherein a gate terminal of the first pull-up transistor of the master driver stage is shorted to the gate terminal of the second pull-up transistor of the slave driver stage.

22. The display gate driver circuit of claim 20 further comprising a pass transistor that is connected to the gate terminal of the first pull-down transistor in the master driver stage, and wherein the pass transistor has a gate terminal directly connected to one of the fixed power supply lines.

* * * * *